United States Patent

Harman

(10) Patent No.: US 7,814,967 B2
(45) Date of Patent: Oct. 19, 2010

(54) HEAT EXCHANGER

(75) Inventor: Jayden David Harman, San Rafael, CA (US)

(73) Assignee: New Pax, Inc., San Rafael ( * ) Notice: Subject to any disclaimer, the term of this patent is extended or adjusted under 35 U.S.C. 154(b) by 0 days.

(21) Appl. No.: 11/774,594

(22) Filed: Jul. 7, 2007

(65) Prior Publication Data

US 2008/0023188 A1 Jan. 31, 2008

Related U.S. Application Data

(63) Continuation of application No. 11/484,123, filed on Jul. 10, 2006, now Pat. No. 7,287,580, which is a continuation of application No. 10/884,713, filed on Jul. 1, 2004, now Pat. No. 7,096,934, which is a continuation of application No. PCT/AU03/00006, filed on Jan. 3, 2003.

(30) Foreign Application Priority Data

Jan. 3, 2002 (AU) ..................... PR9825

(51) Int. Cl.
*F28F 1/40* (2006.01)
(52) U.S. Cl. ...................... 165/181; 165/175
(58) Field of Classification Search ............. 165/109.1, 165/146, 147, 157, 158, 173, 174, 175, 181, 165/DIG. 346, DIG. 348, DIG. 471, DIG. 525, 165/DIG. 526, DIG. 530
See application file for complete search history.

(56) References Cited

U.S. PATENT DOCUMENTS

| | | |
|---|---|---|
| 11,544 A | 8/1854 | Andrews |
| 0,700,785 A | 5/1902 | Kull |
| 0,794,926 A | 7/1905 | Crawford |
| 871,825 A | 11/1907 | Schupmann |
| 0,879,583 A | 2/1908 | Pratt |
| 0,943,233 A | 12/1909 | Boyle |
| 0,965,135 A | 7/1910 | Gibson |
| 0,969,101 A | 8/1910 | Gibson |
| 1,023,225 A | 4/1912 | Shlosberg |
| 1,272,180 A | 7/1918 | Andresen |
| 1,353,478 A | 9/1920 | Jeffries, Sr. |

(Continued)

FOREIGN PATENT DOCUMENTS

AU 62946/96 2/1997

(Continued)

OTHER PUBLICATIONS

Definition of "logarithmic spiral", Wikipedia, http://en.wikipedia.org/wiki/Logarithmic_spiral, Feb. 18, 2010.*

(Continued)

*Primary Examiner*—Teresa J Walberg
(74) *Attorney, Agent, or Firm*—Carr & Farrell LLP

(57) ABSTRACT

A heat exchanger having an active surface over which a fluid flows to affect an exchange of heat between the active surface and the fluid. In some embodiments, the active surface includes a logarithmic spiral wherein the radius of the logarithmic spiral measured at equiangular radii unfolds at a constant order of growth. Further embodiments exhibit an active surface conforming to the internal or external surface of particular classes or genera of shells.

20 Claims, 11 Drawing Sheets

U.S. PATENT DOCUMENTS

| | | | |
|---|---|---|---|
| 1,356,676 A * | 10/1920 | Weller et al | 165/148 |
| 1,396,583 A | 11/1921 | Krafve | |
| 1,471,697 A * | 10/1923 | Kubes | 366/149 |
| 1,505,893 A | 8/1924 | Hunter et al. | |
| 1,658,126 A | 2/1928 | Jehle | |
| 1,667,186 A | 4/1928 | Bluehdorn | |
| 1,709,217 A | 4/1929 | Hamilton | |
| 1,713,047 A | 5/1929 | Maxim | |
| 1,729,018 A | 9/1929 | Siders | |
| 1,756,916 A | 4/1930 | Stranahan | |
| 1,799,039 A | 3/1931 | Conejos | |
| 1,812,413 A | 6/1931 | Reynolds | |
| 1,816,245 A | 7/1931 | Wolford | |
| 1,872,075 A | 8/1932 | Dolza | |
| 1,891,170 A | 12/1932 | Nose | |
| 1,919,250 A | 7/1933 | Olson | |
| 2,068,686 A | 1/1937 | Lascroux | |
| 2,139,736 A | 12/1938 | Durham | |
| 2,165,808 A | 7/1939 | Murphy | |
| 2,210,031 A * | 8/1940 | Greene | 62/117 |
| 2,359,365 A | 10/1944 | Katcher | |
| 2,879,861 A | 3/1959 | Belsky et al. | |
| 2,908,344 A | 10/1959 | Maruo | |
| 2,912,063 A | 11/1959 | Barnes | |
| 2,958,390 A | 11/1960 | Montague | |
| 3,066,755 A | 12/1962 | Diehl | |
| 3,071,159 A * | 1/1963 | Coraggioso | 138/38 |
| 3,076,480 A | 2/1963 | Vicard | |
| 3,081,826 A | 3/1963 | Loiseau | |
| 3,082,695 A | 3/1963 | Buschhorn | |
| 3,215,165 A | 11/1965 | Broadway | |
| 3,232,341 A * | 2/1966 | Woodworth | 165/111 |
| 3,339,631 A * | 9/1967 | Mcgurty et al. | 165/109.1 |
| 3,371,472 A | 3/1968 | Krizman, Jr. | |
| 3,407,995 A | 10/1968 | Kinsworthy | |
| 3,584,701 A | 6/1971 | Freeman | |
| 3,692,422 A | 9/1972 | Girardier | |
| 3,800,951 A | 4/1974 | Mourlon | |
| 3,927,731 A | 12/1975 | Lancaster | |
| 3,940,060 A | 2/1976 | Viets | |
| 3,957,133 A | 5/1976 | Johnson | |
| 3,964,841 A | 6/1976 | Strycek | |
| 4,050,539 A | 9/1977 | Kashiwara et al. | |
| 4,182,596 A | 1/1980 | Wellman | |
| 4,206,783 A | 6/1980 | Brombach | |
| 4,211,183 A | 7/1980 | Hoult | |
| 4,225,102 A | 9/1980 | Frosch et al. | |
| 4,299,553 A | 11/1981 | Swaroop | |
| 4,317,502 A | 3/1982 | Harris et al. | |
| 4,323,209 A | 4/1982 | Thompson | |
| 4,331,213 A | 5/1982 | Taniguchi | |
| 4,505,297 A | 3/1985 | Leech et al. | |
| 4,533,015 A | 8/1985 | Kojima | |
| 4,540,334 A | 9/1985 | Stahle | |
| 4,579,195 A | 4/1986 | Nieri | |
| 4,644,135 A | 2/1987 | Daily | |
| 4,679,621 A | 7/1987 | Michele | |
| 4,685,534 A | 8/1987 | Burstein et al. | |
| 4,699,340 A | 10/1987 | Rethorst | |
| 4,823,865 A * | 4/1989 | Hughes | 165/109.1 |
| 4,834,142 A | 5/1989 | Johannessen | |
| 4,993,487 A | 2/1991 | Niggemann | |
| 5,010,910 A | 4/1991 | Hickey | |
| 5,040,558 A | 8/1991 | Hickey et al. | |
| 5,052,442 A | 10/1991 | Johannessen | |
| 5,058,837 A | 10/1991 | Wheeler | |
| 5,100,242 A | 3/1992 | Latto | |
| 5,139,215 A | 8/1992 | Peckham | |
| 5,181,537 A | 1/1993 | Powers | |
| 5,207,397 A | 5/1993 | Ng et al. | |
| 5,220,955 A | 6/1993 | Stokes | |
| 5,249,993 A | 10/1993 | Martin | |
| 5,261,745 A | 11/1993 | Watkins | |
| 5,312,224 A | 5/1994 | Batchelder et al. | |
| 5,335,669 A | 8/1994 | Cook et al. | |
| 5,382,092 A | 1/1995 | Okamoto et al. | |
| 5,624,229 A | 4/1997 | Kotzur et al. | |
| 5,661,638 A | 8/1997 | Mira | |
| 5,741,118 A | 4/1998 | Shinbara et al. | |
| 5,787,974 A | 8/1998 | Pennington | |
| 5,844,178 A | 12/1998 | Lothringen | |
| 5,891,148 A | 4/1999 | Deckner | |
| 5,934,612 A | 8/1999 | Gerhardt | |
| 5,934,877 A * | 8/1999 | Harman | 416/223 R |
| 5,943,877 A | 8/1999 | Chen | |
| 5,954,124 A | 9/1999 | Moribe et al. | |
| 6,050,772 A | 4/2000 | Hatakeyama et al. | |
| 6,179,218 B1 | 1/2001 | Gates | |
| 6,241,221 B1 | 6/2001 | Wegner et al. | |
| 6,273,679 B1 | 8/2001 | Na | |
| 6,374,858 B1 | 4/2002 | Hides et al. | |
| 6,382,348 B1 | 5/2002 | Chen | |
| 6,385,967 B1 | 5/2002 | Chen | |
| 6,415,888 B2 | 7/2002 | An et al. | |
| 6,484,795 B1 * | 11/2002 | Kasprzyk | 165/109.1 |
| 6,604,906 B2 | 8/2003 | Ozeki | |
| 6,623,838 B1 | 9/2003 | Nomura et al. | |
| 6,632,071 B2 | 10/2003 | Pauly | |
| 6,669,142 B2 | 12/2003 | Saiz | |
| 6,684,633 B2 | 2/2004 | Jett | |
| D487,800 S | 3/2004 | Chen et al. | |
| 6,702,552 B1 | 3/2004 | Harman | |
| 6,817,419 B2 | 11/2004 | Reid | |
| 6,892,988 B2 | 5/2005 | Hugues | |
| 6,932,188 B2 | 8/2005 | Ni | |
| D509,584 S | 9/2005 | Li et al. | |
| 6,959,782 B2 | 11/2005 | Brower et al. | |
| 7,117,973 B2 | 10/2006 | Graefenstein | |
| D539,413 S | 3/2007 | Parker et al. | |
| 2002/0148777 A1 | 10/2002 | Tuszko et al. | |
| 2004/0037986 A1 | 2/2004 | Houston et al. | |
| 2004/0238163 A1 | 12/2004 | Harman | |
| 2004/0244853 A1 | 12/2004 | Harman | |
| 2005/0011700 A1 | 1/2005 | Dadd | |
| 2005/0155916 A1 | 7/2005 | Tuszko et al. | |
| 2005/0269458 A1 | 12/2005 | Harman | |
| 2006/0102239 A1 | 5/2006 | Harman | |
| 2006/0249283 A1 | 11/2006 | Harman | |
| 2007/0003414 A1 | 1/2007 | Harman | |
| 2007/0025846 A1 | 2/2007 | Harman | |

FOREIGN PATENT DOCUMENTS

| | | | |
|---|---|---|---|
| DE | 33 15 258 | * | 10/1984 |
| EP | 14257 | | 8/1980 |
| EP | 0598253 | | 5/1994 |
| FR | 2534981 A | | 10/1982 |
| FR | 2666031 A | | 2/1992 |
| GB | 873135 | | 7/1961 |
| GB | 2057567 A | | 4/1981 |
| GB | 2 063 365 A | | 6/1981 |
| JP | 98264 | | 6/1932 |
| JP | 98264 B | | 6/1932 |
| JP | 54-129699 | | 8/1979 |
| JP | S54129699 | | 10/1979 |
| JP | 05332121 | | 12/1993 |
| JP | 00257610 | | 9/2000 |
| JP | 2000257610 | | 9/2000 |
| JP | D1243052 | | 6/2005 |
| SU | 738566 | * | 6/1980 |
| SU | 850104 | * | 7/1981 |
| SU | 1030631 | * | 7/1983 |
| TW | 565374 | | 3/2002 |
| TW | M287387 | | 2/2006 |

| WO | WO 81/03201 | 11/1981 |
| WO | WO 87 07048 A | 11/1987 |
| WO | WO 89 08750 A | 9/1989 |
| WO | WO 00/38591 | 7/2000 |
| WO | WO 01 14782 | 3/2001 |
| WO | WO 03 056228 A | 7/2003 |
| WO | WO 3056269 A1 | 7/2003 |
| WO | WO 2005/045258 | 5/2005 |
| WO | WO 2005/073561 | 8/2005 |

OTHER PUBLICATIONS

Derwent Abstract Accession No. 87-318963/45, SU 1291726 A (Makeevka Eng Cons) Feb. 23, 1987.
Derwent Abstract Accession No. 99-249047/32, JP 11072104 A (Saito Jidosha Shatai Kogyo KK) Mar. 16, 1999.
Patent Abtracts of Japan, Publication No. 2000-168632, Jun. 20, 2000, "Low Air Resistance Vehicle Body Using Vortex Ring."
Derwent Abstract Accession No. 97-198067/18, JP 09053787 A (Kajima Corp) Feb. 25, 1997.
Derwent Abstract Accession No. 97-546288/50, JP 09264462 A (Sekisui Chem Ind Co Ltd) Oct. 7, 1997.
Derwent Abstract Accession No. 1999-380417/32, JP 11148591 A (TLV Co Ltd) Jun. 2, 1999.
Derwent Abstract Accession No. E6575C/21, SU 687306A (Leningrad Forestry Acad) Sep. 28, 1977.
Derwent Abstract Accession No. N8420 E/42, SU 887876 A (As Ukr Hydromechani) Dec. 7, 1981.
Derwent Abstract Accession No. 85-073498/12, SU 1110986 A (Korolev A S) Aug. 30, 1984.
Derwent Abstract Accession No. 89-075095/10, SU 1418540 A (As Ukr Hydrodynamic) Aug. 23, 1988.
Derwent Abstract Accession No. 91-005279, SU 1560887 A (Sredaztekhenergo En) Apr. 30, 1990.
Derwent Abstract Accession No. 93-375668/47, SU 1756724 A (Odess Poly) Aug. 30, 1992.
Derwent Abstract Accession No. L0015B/47, SE 7803739 A (Ingenjorsfirma Garl) Nov. 5, 1979.
Dr. Knott, Ron, "The Golden Section Ration: Phi," Available at http://www.mcs.surrey.ac.uk/Personal/R.Knott/Fibonacci/phi.html.
Derwent Abstract Accession No. 89-157673, SU 1437579A (Lengd Kalinin Poly) Nov. 15, 1988.
K. Foster et al., "Fluidics Components and Circuits," Wiley-Interschience, London, 1971, pp. 219-221.
Karassik et al "Pump Handbook" pub. 1976 by McGraw-Hill, Inc.
McLarty et al., "Phi Geometry: Impeller & Propeller Design for Fluids Handling", Offshore Magazine, pp. 123—Oct. 1999.
Derwent Abstract Accession No. K2273W/37, SU 431850 A (Fishing Ind Exp), (Apr. 1975).
Derwent Abstract Accession No. 51960 E/25, SU 858896 A (Onatskii P A), (Aug. 1981).
The CAD Guidebook, A Basic Manual for Understanding and Improving Computer-Aided Design, Stephen J. Schoonmaker, Marcel Dekker, Inc., New York, 2002, pp. 128,188-196,202,231-233,248.
Merriam-Webster Online Dictionary, 2010 http://www.merriam-webster.com/dictionary/spiral, Feb. 23, 2010, two pages.
Merriam-Webster Online Dictionary, 2010 http://www.merriam-webster.com/dictionary/curve, Feb. 23, 2010, two pages.
Merriam-Webster Online Dictionary, 2010 http://www.merriam-webster.com/dictionary/vortex, Feb. 23, 2010, two pages.
Merriam-Webster Online Dictionary, 2010 http://www.merriam-webster.com/dictionary/vortical, Feb. 23, 2010, two pages.

* cited by examiner

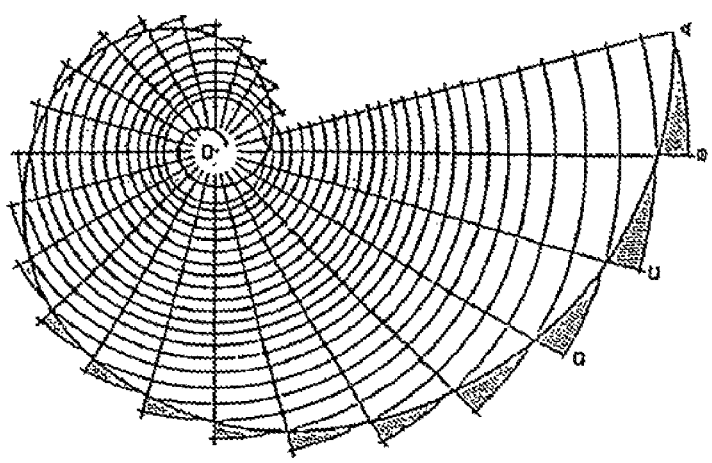
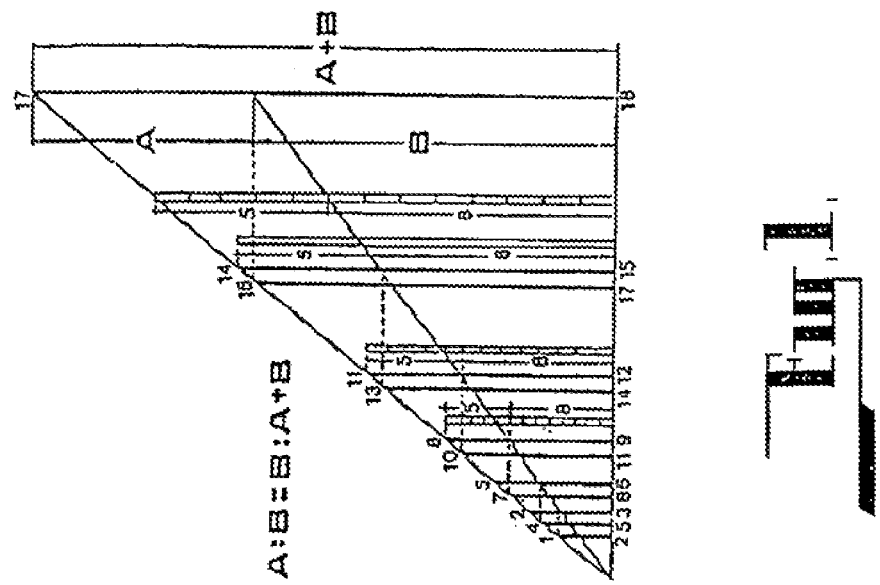
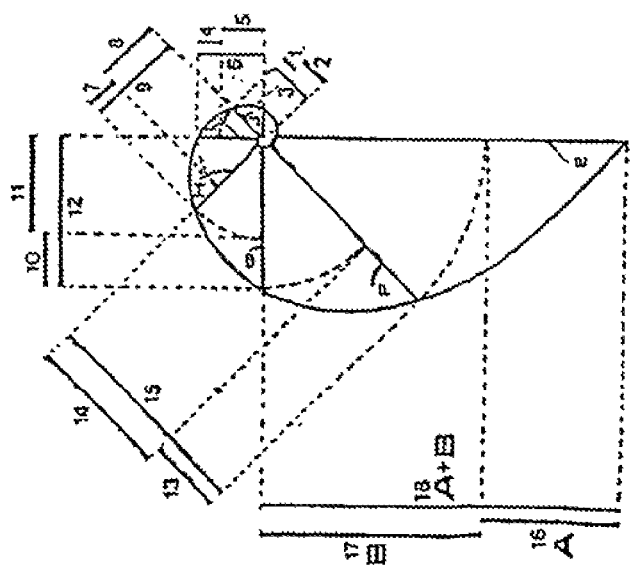
Fig. 1

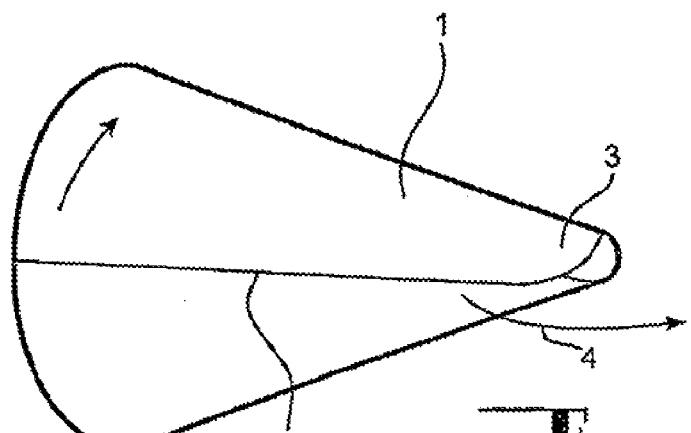
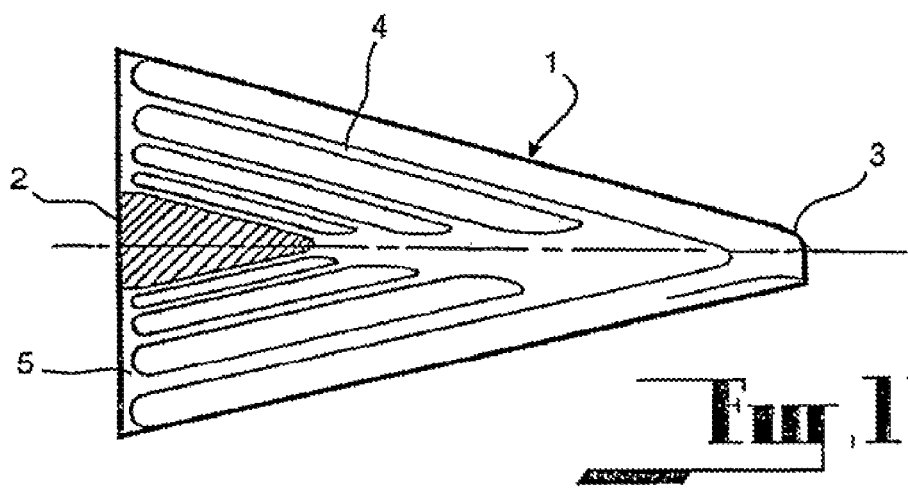
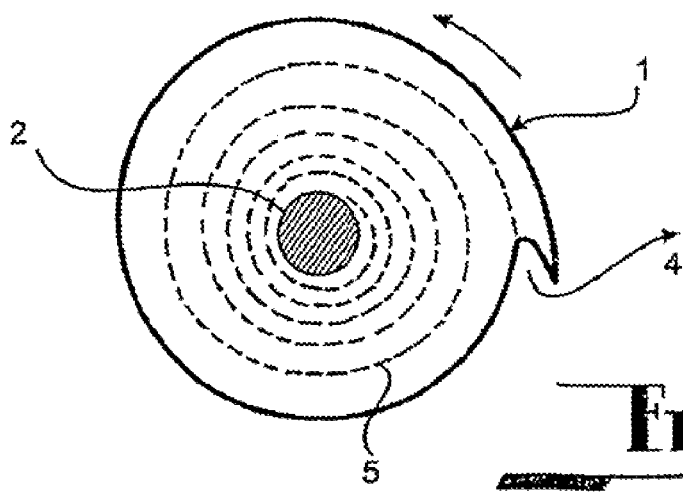

HEAT EXCHANGER

CROSS REFERENCE TO RELATED APPLICATIONS

This application is a divisional and claims the priority benefit of U.S. patent application Ser. No. 11/484,123 filed Jul. 10, 2006 and now U.S. Pat. No. 7,287,580 which is a continuation and claims the priority benefit of U.S. patent application Ser. No. 10/884,713 filed Jul. 1, 2004 and now U.S. Pat. No. 7,096,934, which is a continuation application and claims the priority benefit of Patent Cooperation Treaty Application Number PCT/AU03/00006 filed Jan. 3, 2003, and now expired, which in turn claims the priority benefit of Australian patent application number PR9825 filed Jan. 3, 2002. The disclosures of these applications are incorporated herein by reference.

BACKGROUND OF THE INVENTION

1. Field of the Invention

The present invention relates to a heat dispersing structure (heat sink or heat exchanger or radiator), which assists heat energy to be dispersed from or to a solid material and optimises the transfer of the heat energy to or from a fluid (or vice versa) surrounding the structure more efficiently than in state of the art heat sinks or thermal conductors. It may also be used where two solid or fluid plasma conductors are adjacent to each other and there is a thermal transfer required from one material to the other. Among other uses, this invention relates to heat sinks for electronic circuit boards, cooling fins for radiators, compressors and internal combustion engines, fluid carrying tubes for radiators and heat exchangers, air conditioning and refrigeration systems, plasma generators, and fluid or bimetal heat exchangers.

2. Description of the Related Art

A considerable number of structures have been devised to aid the transfer of heat energy between a solid material and a fluid. A few examples of these include heat sinks, radiant heaters, automobile radiators, and air-conditioning heat exchangers. Heat sinks are commonly thought of in relation to the cooling of the solid material and comprise an array of fins associated with the solid material. The principle object of such devices has been to increase the surface area of solid material contacting the fluid to thereby increase the transfer of heat energy to the fluid. Of course, it is well known that finned arrays can also be used in heating appliances where the object is to heat a fluid. Automobile radiators are designed to disperse heat from the engine to the atmosphere by transferring heat energy from the coolant to the core of the radiator and then from the core of the radiator to the atmosphere. This latter transfer is again assisted by fins to increase surface area. Similar arrangements are found in a multitude of other applications.

Typically, the design of such structures used in the transfer of heat energy between a solid and a fluid has been directed to maximising the surface area made available between the solid and the fluid. Nevertheless, the efficiency of such structures in effecting heat transfer also depends upon the flow of the fluid over the solid material. Many structures have been devised that provide considerable surface area but are not particularly efficient due to the restricted flow of the fluid past the structure. In many cases, the natural flow is supplemented by a forced fluid flow past the heat exchanger.

Nature is recognised as using the most efficient energy transfer systems known to man. Invariably, Nature propagates heat in a turbulent motion. At its most efficient, this turbulence is concentrated into a three dimensional singular vortical motion. The shape of this convectional fluid flow is expressed in equiangular logarithmic spirals, where the ratio of contraction or expansion is approximately 1:0.618, or the celebrated Golden Proportion. An example of this flow structure in a fluid is a tornado. Another example is the flame and smoke pattern arising from a fire storm. Prior technology pays little regard to such natural flow characteristics.

It has been said that nature always follows the path of least resistance. Movement and growth in nature flow in a particular specific, logarithmic geometric progression—that of the three dimensional Golden Proportion or equiangular spiral. The intention of the invention is to induce optimum energy transfer by channeling the fluids into their natural flow tendencies by full or partial adherence to Nature's equiangular, logarithmic, path of movement. The invention capitalizes on natural vortical flow geometry.

Vortical structures act as 'heat pumps' (i.e. they can only exist if there is a temperature differential and vice versa). The invention seeks to exploit the exceptional cooling features of vortices. Part of their effectiveness is that vortex geometry can provide high non turbulent rates of adiabatic expansion (i.e. heat can be dumped or acquired in an optimum time and distance). The simplest, essential and most common form of a vortex is a vortex ring or torroid. (FIGS. 13 and 14).

One of the interesting and exploitable properties of a vortex ring is that is has remarkably low friction and is a rapid and highly efficient transporter of fluids and heat.

In order to optimise the cooling efficiency of any radiator, heat exchanger, of heat sink, it is beneficial to establish, maintain, and exploit individual vortex structures. Fluid flow, both internally and externally, may be torroid in shape, Bernard cells, the shape of a convection vortex, or a potential vortex. All of the above comply approximately to the three-dimensional Golden Section or equiangular spiral.

An excellent example of this prior technology is the Ranque-Hilsch tube. (FIG. 13). Applying the design criteria of the embodiments of this invention, wholly or in part, will improve performance of existing thermal conductor structures.

SUMMARY OF THE INVENTION

All the embodiments presently claimed provide for a tank for conducting a heat exchange. In each of the embodiments, the tank includes a wall. The wall includes a front side and a rear side.

In one exemplary embodiment, vents are disposed through the wall. A first end of each of the events opens through the front side of the wall. A second end of each of the vents opens through a second side of the wall. The vents each include an active surface that substantially confirms in at least one dimension to a logarithmic spiral. When measured at equiangular radii, the radius of the logarithmic spiral unfolds at a constant order of growth. Passage of a fluid through the vents and over a portion of the active surface of each of the vents creates a temperature differential between the front side and the rear side of the wall. The temperature differential results in a heat exchange through the wall.

In another embodiment, the active surface of each of the vents substantially conforms to the external configuration of a shell of the phylum Mollusca, class Gastropoda or Cephalopoda. Passage of a fluid through the vents and over a portion of the active surface of each of the vents creates a temperature differential between the front side and the rear side of the wall. The temperature differential results in a heat exchange through the wall.

In another embodiment, the active surface of each of the vents substantially conforms to the external configuration of a shell of the genera *Volutidea, Argonauta, Nautilus, Conidea*, or *Turbinidea*. Passage of a fluid through the vents and over a portion, of the active surface of each of the vents creates a temperature differential between the front side and the rear side of the wall. The temperature differential results in a heat exchange through the wall.

In another embodiment, the active surface of each of the vents substantially conforms to the internal configuration of a shell of the phylum Mollusca, class Gastropoda or Cephalopoda. Passage of a fluid through the vents and over a portion of the active surface of each of the vents creates a temperature differential between the front side and the rear side of the wall. The temperature differential results in a heat exchange through the wall.

In another embodiment, the active surface of each of the vents substantially conforms to internal configuration of a shell of the genera *Volutidea, Argonauta, Nautilus, Conidea*, or *Turbinidea*. Passage of a fluid through the vents and over a portion of the active surface of each of the vents creates a temperature differential between the front side and the rear side of the wall. The temperature differential results in a heat exchange through the wall.

In another embodiment, the active surface of each of the vents substantially conforms to the configuration of a whorl. Passage of a fluid through the vents and over a portion of the active surface of each of the vents creates a temperature differential between the front side and the rear side of the wall. The temperature differential results in a heat exchange through the wall.

In a further embodiment, and as in the aforementioned embodiments, the tank includes a wall. The wall includes a front side and a rear side. Like the aforementioned embodiments, vents are disposed through the wall. A first end of each of the events opens through the front side of the wall. A second end of each of the vents opens through a second side of the wall.

In this particular embodiment, each of the vents includes a vane. The vane includes an active surface that substantially conforms in at least one dimension to a logarithmic spiral. When measured at equiangular radii, the radius of the logarithmic spiral unfolds at a constant order of growth. Passage of a fluid through the vents and over a portion of the active surface of the vane of each of the vents creates a temperature differential between the front side and the rear side of the wall. The temperature differential results in a heat exchange through the wall.

In another embodiment, the active surface of each of the vanes substantially conforms to the external configuration of a shell of the phylum Mollusca, class Gastropoda or Cephalopoda. Passage of a fluid through the vents and over a portion of the active surface of the vane of each of the vents creates a temperature differential between the front side and the rear side of the wall. The temperature differential results in a heat exchange through the wall.

In another embodiment, the active surface of each of the vanes substantially conforms to the external configuration of a shell of the genera *Volutidea, Argonauta, Nautilus, Conidea*, or *Turbinidea*. Passage of a fluid through the vents and over a portion of the active surface of the vane of each of the vents creates a temperature differential between the front side and the rear side of the wall. The temperature differential results in a heat exchange through the wall.

In another embodiment, the active surface of each of the vanes substantially conforms to the configuration of a whorl. Passage of a fluid through the vents and over a portion of the active surface of the vane of each of the vents creates a temperature differential between the front side and the rear side of the wall. The temperature differential results in a heat exchange through the wall.

In another embodiment, the active surface of each of the vanes substantially conforms to the internal configuration of a shell of the phylum Mollusca, class Gastropoda or Cephalopoda. Passage of a fluid through the vents and over a portion of the active surface of the vane of each of the vents creates a temperature differential between the front side and the rear side of the wall. The temperature differential results in a heat exchange through the wall.

In another embodiment, the active surface of each of the vanes substantially conforms to the internal configuration of a shell of the genera *Volutidea, Argonauta, Nautilus, Conidea*, or *Turbinidea*. Passage of a fluid through the vents and over a portion of the active surface of the vane of each of the vents creates a temperature differential between the front side and the rear side of the wall. The temperature differential results in a heat exchange through the wall.

BRIEF DESCRIPTION OF THE DRAWINGS

FIG. 1 is a chart of the Golden Section of Fibonacci Progression;

FIG. 10 is a side view of a fourth embodiment of a heat exchanger according the invention;

FIG. 11 is a sectional side view of the fourth embodiment;

FIG. 12 is an end elevation of the fourth embodiment;

DETAILED DESCRIPTION

Figure 3:
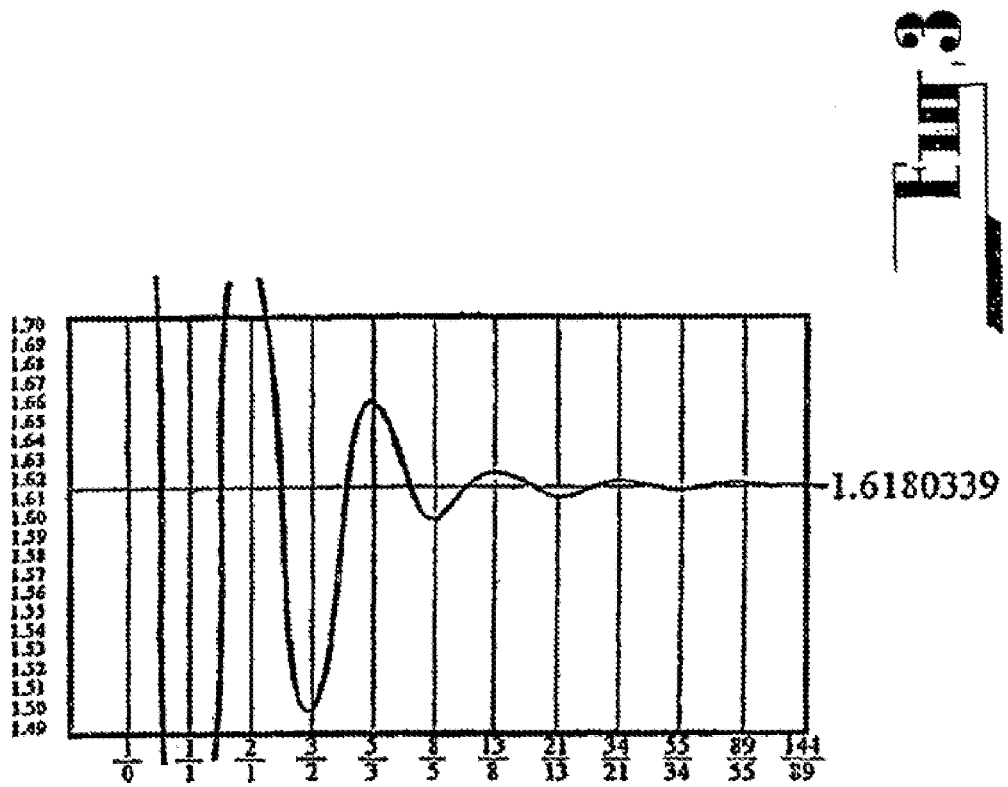
FIG. 3 is a graph depicting the geometric progression ratio of the structure of a Golden Section vortex.
Figure 2:
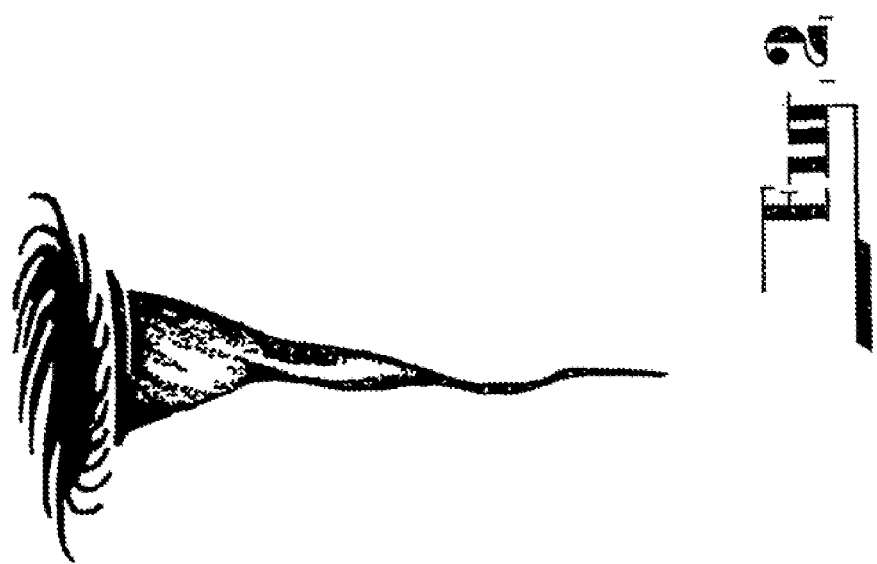
FIG. 2 is a schematic side view of a natural vortex which conforms to the Golden Section.
Figure 4:
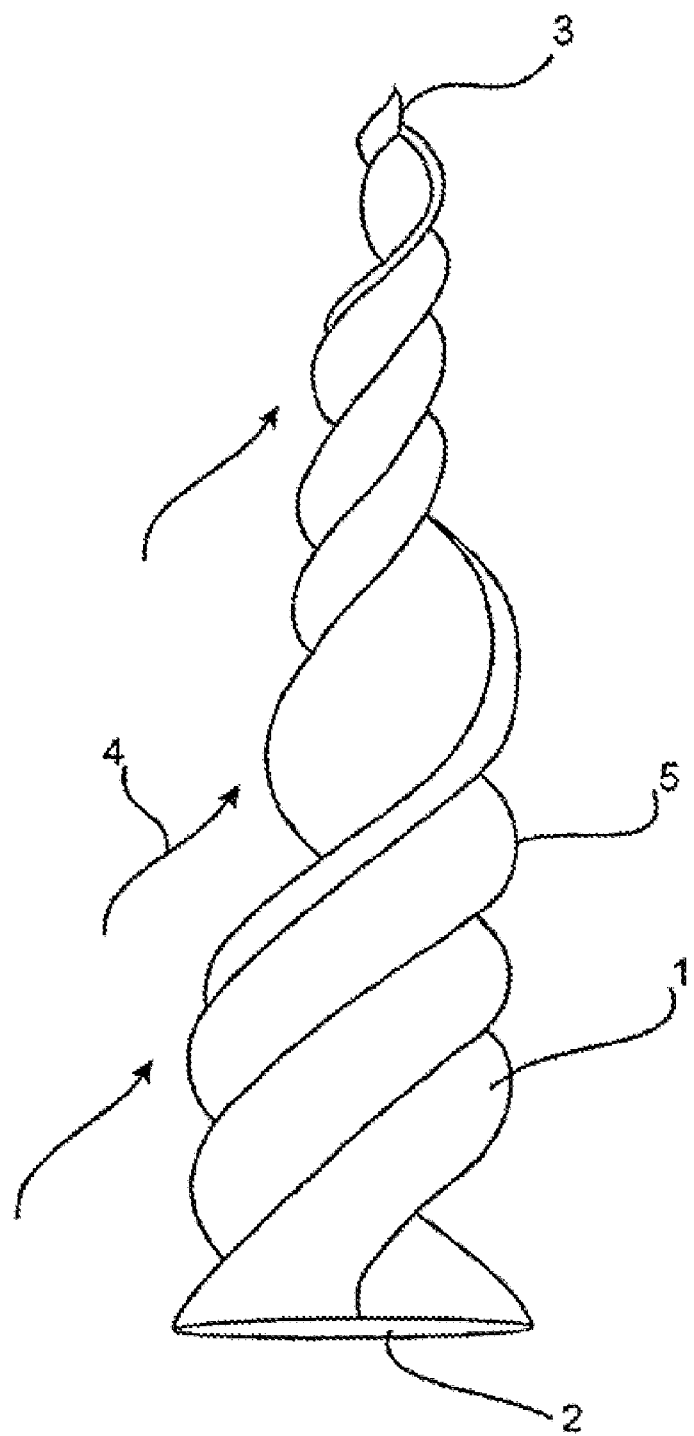
FIG. 4 is a side elevation of a heat exchanger according to a first embodiment of the invention.
Figure 5:
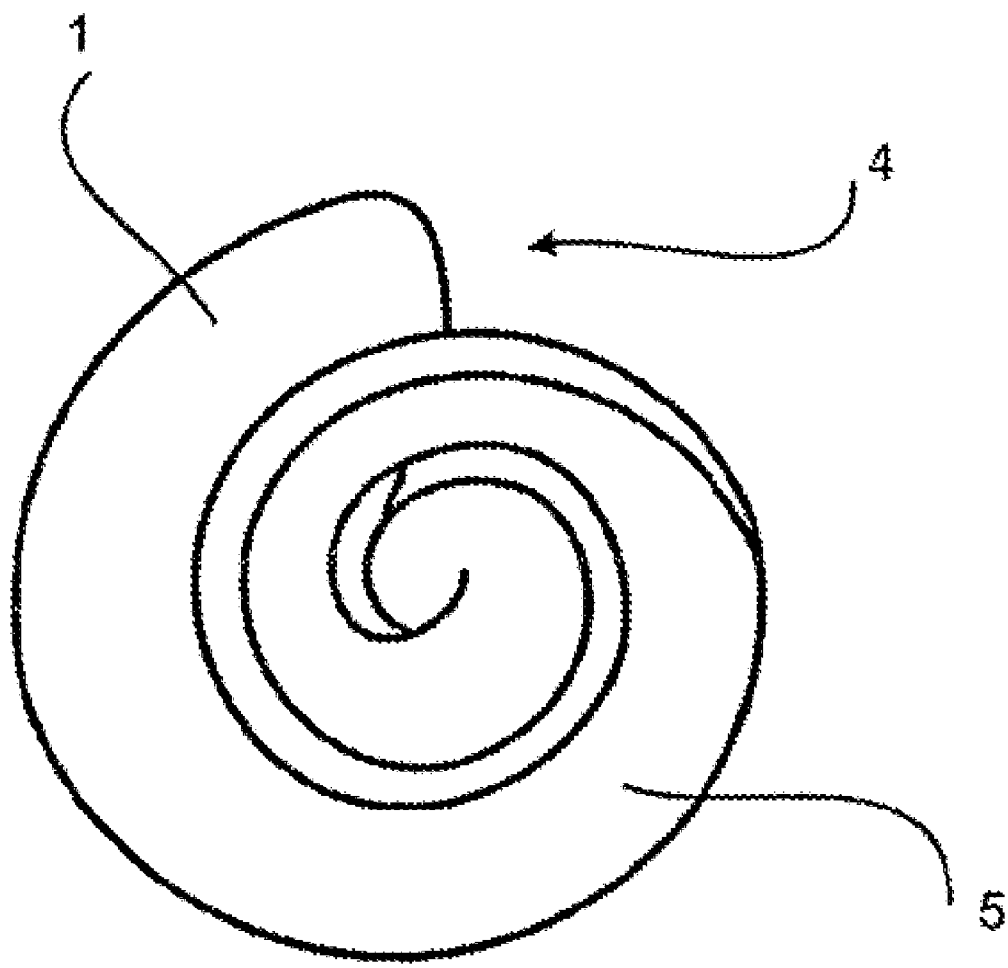
FIG. 5 is an end view of the heat exchanger of the first embodiment as shown in FIG. 4.

Each of the embodiments is directed to a heat exchanger which is adapted to affect the transfer of heat between a solid surface and a fluid. As stated previously all fluids when moving under the influence of the natural forces of nature tend to move in spirals or vortices. These spirals or vortices generally conform to a mathematical progression known as the Golden Section or the Fibonacci Progression. Each of the embodiments serves to enable fluids to move in their naturally preferred way, thereby reducing inefficiencies created through turbulence and friction which are normally found in apparatus commonly used in such heat exchangers. Previously developed technologies have generally been less compliant with natural fluid flow tendencies.

The heat exchangers of each of the embodiments described herein are generally designed in all respects, in accordance with the Golden Section and therefore it is a characteristic of each of the embodiments that the heat exchanger provides a fluid pathway which is of a spiraling configuration and which conforms at least generally to the characteristics of the Golden Section. The characteristics of the Golden Section are illustrated in FIG. 1 which illustrates the unfolding of the spiral curve according to the Golden Section. As the spiral unfolds the order of growth of the radius of the curve which is measured at equiangular radii (e.g. E, F, G, H, I and J) is constant. This can be illustrated from the triangular representation of each radius between each sequence which corresponds to the formula of a:b=b:a+b which conforms to the ratio of 1:0.618 and which is consistent through out the curve.

It is a characteristic of each of the embodiments that the curvature of the surfaces which form the heat exchanger takes a two dimensional or three dimensional shape and which substantially conform to the characteristics of the Golden Section and that any variation in cross-sectional area of the fluid pathway also substantially conforms to the characteristics of the Golden Section. Furthermore it has been found that the characteristics of the Golden Section are found in nature in the form of the external and internal configurations of shells of the phylum Mollusca, classes Gastropoda and Cephalopoda and it is a common characteristic of at least some of the embodiments that the fluid pathway defined by the heat exchangers corresponds generally to the external or internal configuration of shells of one or more of the genera of the phylum Mollusca, classes Gastropoda and Cephalopoda.

It has been found that it is a characteristic of fluid flow that, when it is caused to undergo a fluid flow through a pathway having a curvature substantially conforming to that of the Golden Section that the fluid flow over the surfaces is substantially non-turbulent and as a result has a decreased tendency to cavitate. As a result, fluid flow over the surface is more efficient than has been encountered in previous instances where the pathway does not substantially correspond to that of the Golden Section. As a result of the reduced degree of turbulence which is induced in the fluid in its passageway through such a pathway, the heat exchangers according to the various embodiments transfer heat between the solid material and the fluid with a greater efficiency than has previously been possible with conventional heat exchangers of equivalent dimensional characteristics. Fluid flow over the surface is streamlined and all of the fluid flows. The configuration avoids dead pockets of "stagnant" fluid, which is a common problem with conventional systems.

FIGS. 4, 5, 6, 7, 8, 9, 10, 11, and 12 illustrate various embodiments of heat exchangers in accordance with the invention. While each of the embodiments has a different appearance, they each share features common to their operation as a heat sink. Therefore, in the drawings, like numerals are used to depict like features.

In each embodiment, the heat exchanger has an active surface which shaped in a similar manner to the cavitation centre of a vortex or to the centre windings or septa of a volute, cone or other sea shell. Each embodiment has a base 2 which is adapted to be attached to a thermal energy source to extend therefrom. As heat is transmitted to the fluid flowing over the active surface of the device from the base (2), the fluid accelerates towards the remote end of the device and as the fluid accelerates, it cools adiabatically which serves to maintain a temperature differential between the active surface of the have exchanger and the fluid to facilitate further heat exchange.

Figure 6:
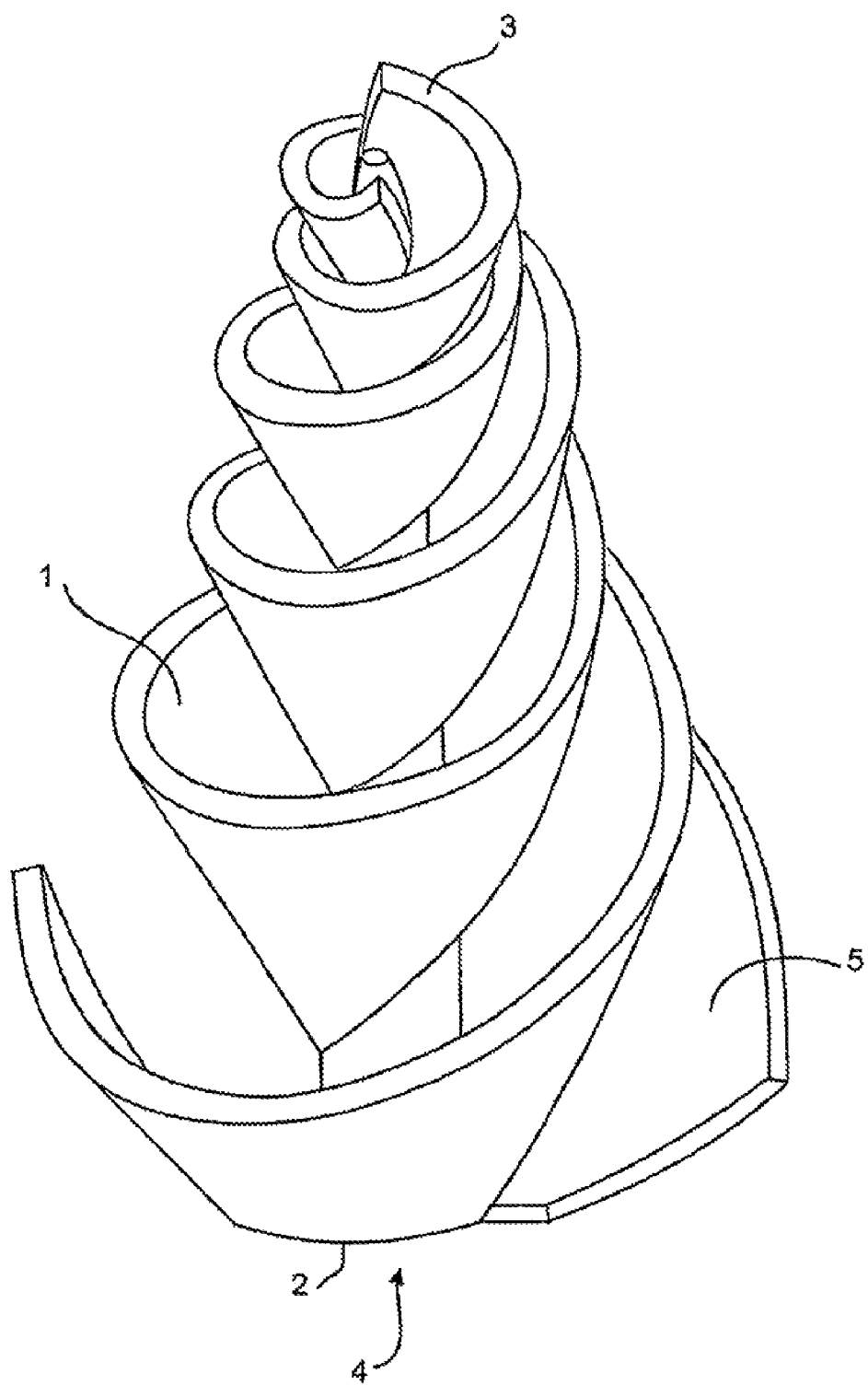
FIG. 6 is a side elevation of a heat exchanger according to a second embodiment.
Figure 7:
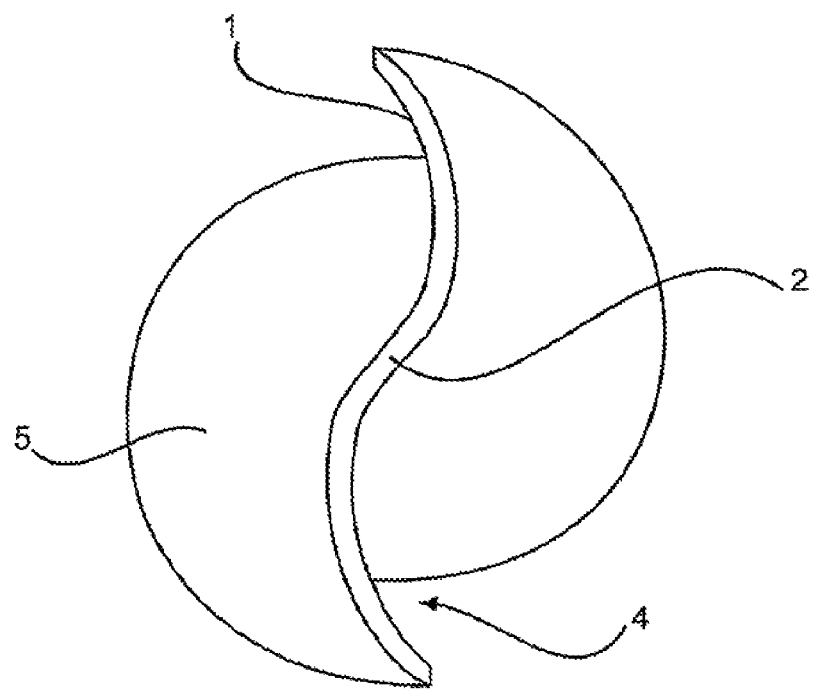
FIG. 7 is an end elevation of the heat exchanger of the second embodiment as in FIG. 6.
Figure 9:
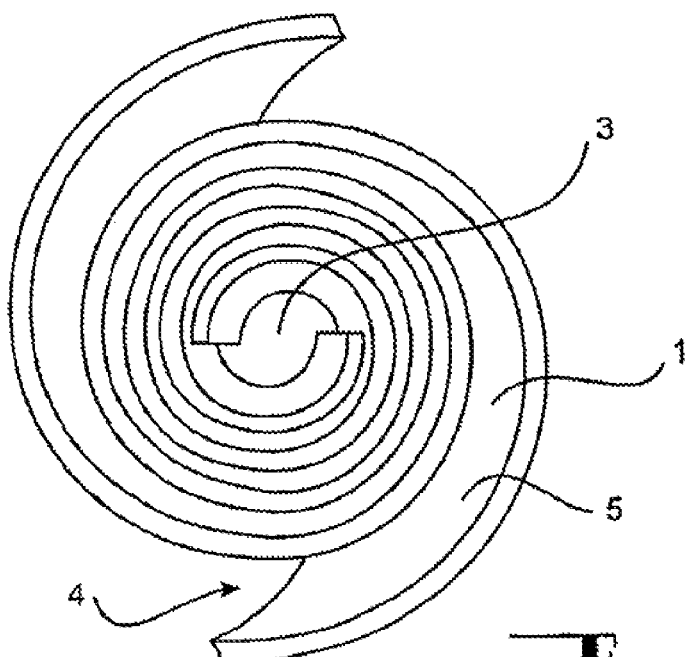
FIG. 9 is an end elevation of the heat exchanger of the third embodiment as in FIG. 8.
Figure 8:
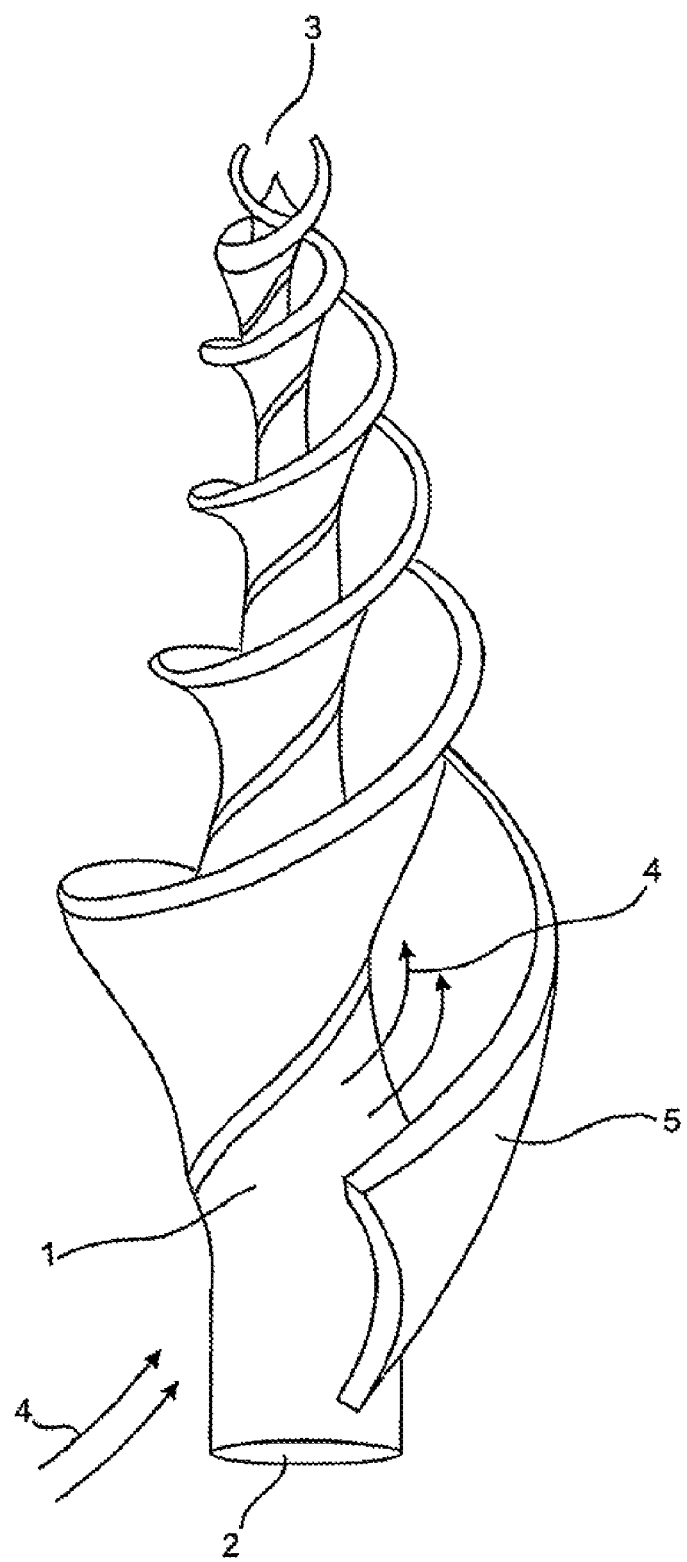
FIG. 8 is a side elevation of a heat exchanger according to a third embodiment.

The active surface (1) may comprise a single vane or rib, as shown in FIGS. 6, 7, 10, 11 and 12 or alternatively may comprise multiple vanes. The heat exchanger (1) may also increase or decrease in profile width (e.g., FIGS. 6 and 8 compared with FIG. 4) in full or partial conformance with the Golden Section depending on desired application. The vanes may be solid, hollow, or represent a vortex shaped void as in FIGS. 14 and 16.

Heat exchangers according to the invention may be used in a wide variety of applications. For example heat sinks designed in accordance with the embodiments depicted in FIGS. 4, 6 and 8 may be adapted to provide cooling to a wide range of heat sources such as semiconductors, power transformers, refrigeration, and heating appliances, to name a few.

In such applications, a more efficient heat transfer is affected by the establishment of a voritcal fluid flow over the surfaces of the heat exchangers. This efficient fluid flow means that more efficient and effective use is made of the heat exchanger which may therefore be smaller than conventional designs.

As indicated earlier, beyond the benefit of improving fluid flow across the surfaces of a heat exchanger, the present invention also offers a further mechanism to effect a temperature differential across a body. In the embodiments as shown in FIGS. 4 to 12, when fluid enters the system at the base 2, it is rapidly accelerated radially in to movement toward the remote end 3 to attain a maximum speed and minimum pressure. As a result, the temperature of the fluid is reduced adiabatically, causing a temperature differential across the vortex. This temperature differential is inherent within a vortical flow. By suitable design, a body may be constructed to take advantage of this differential.

Figure 13:
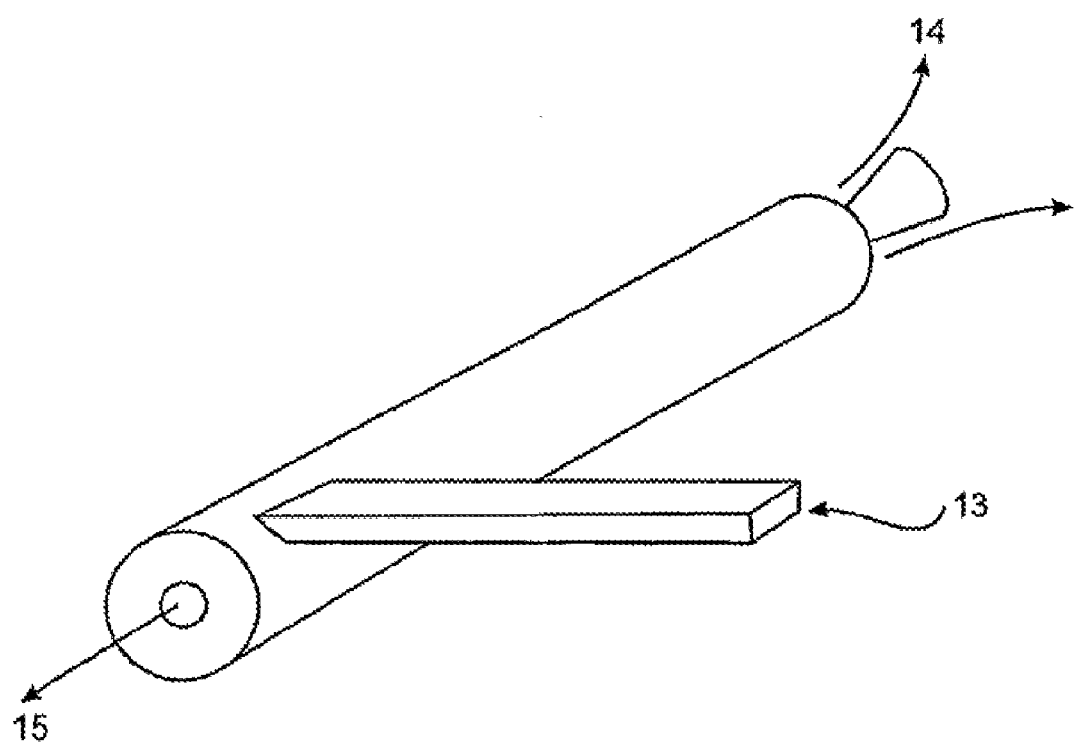
FIG. 13 is a schematic view of a Ranque-Hilsch tube.
Figure 17:
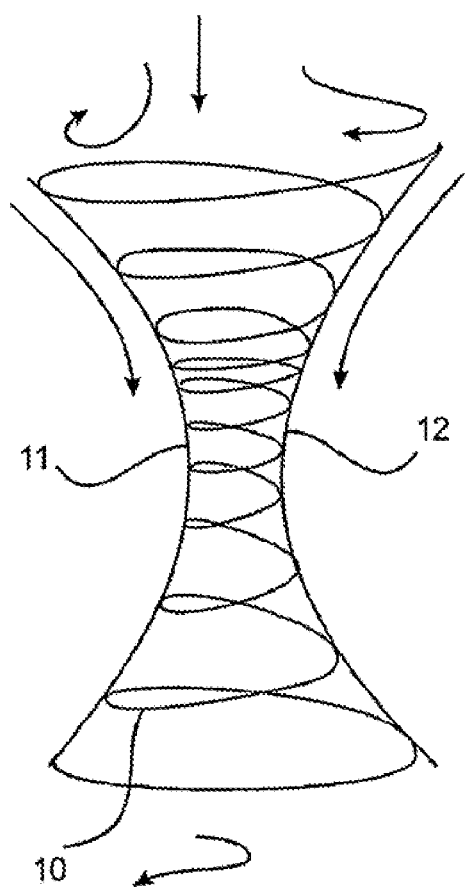
FIG. 17 is a schematic view of the centre of a vortex ring showing the mode of vortical flow of fluid or heat energy.
Figure 14:
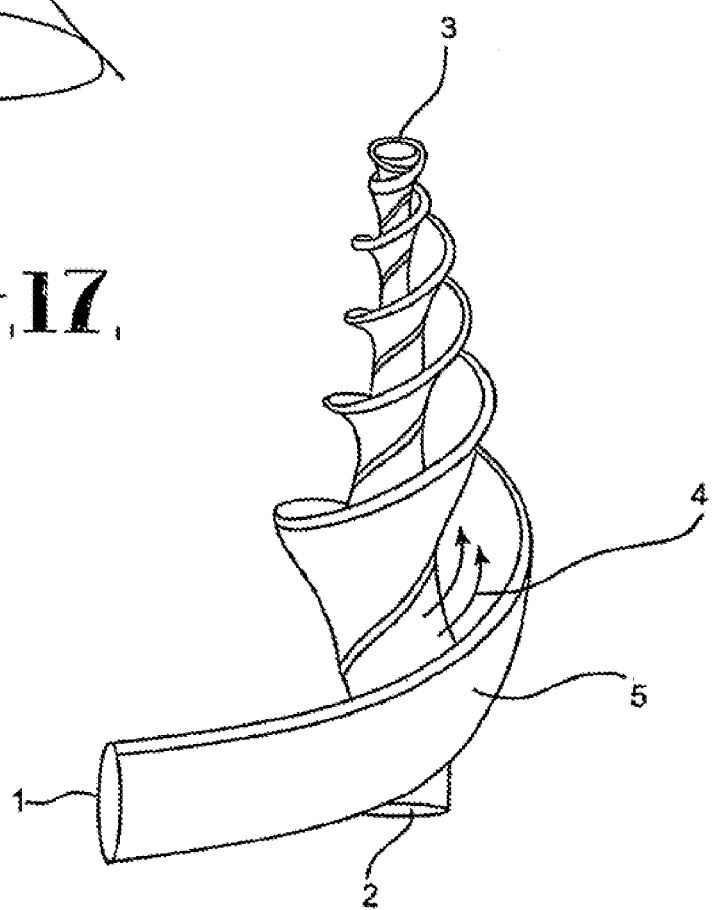
FIG. 14 is schematic view of a refrigerating device according to the fifth embodiment.

FIG. 13, illustrates a Ranque-Hilsch tube in which compressed air enters a tube tangentially at 13. A temperature differential is created radially across the tube with the fluid at the central axis being cooler. In addition, the flow of fluid along the tube at the centre is opposite to that of the perimeter. Therefore, cold air exists at one end 14 hot air exits at the other end 15 as a result of the Ranque effect. Temperatures of −50 degrees Celsius are readily atttainable in these mechanisms. These devices are not presently very energy efficient. Although they are seeking to capitalize on vortical temperature differentials they have not yet been designed according to Phi vortical geometry. As a result, considerable energy is consumed through turbulence and friction which is generated internally. The fifth embodiment as shown at FIG. 14 comprises a refrigeration device similar to a Ranque-Hilsch tube which is designed in accordance with the invention. However, it does not use a parallel-sided pipe as shown in FIG. 13 but will be a hollow version of one of the embodiments as shown in FIGS. 4 to 12 where all surfaces approximate three-dimensional curves according to the Golden Section. Gas is admitted to a hollow spiralling vane 5 through inlet 1 and flows to outlet 3. En-route, the gas accelerates and experiences a pressure drop with a corresponding temperature drop as in a Ranque-Hilsch tube. Hot air is expelled through outlet 2 and cold air is delivered through outlet 3.

When such devices are redesigned in accordance with the principles of the present invention, significant efficiency gains are achieved.

Figure 15:
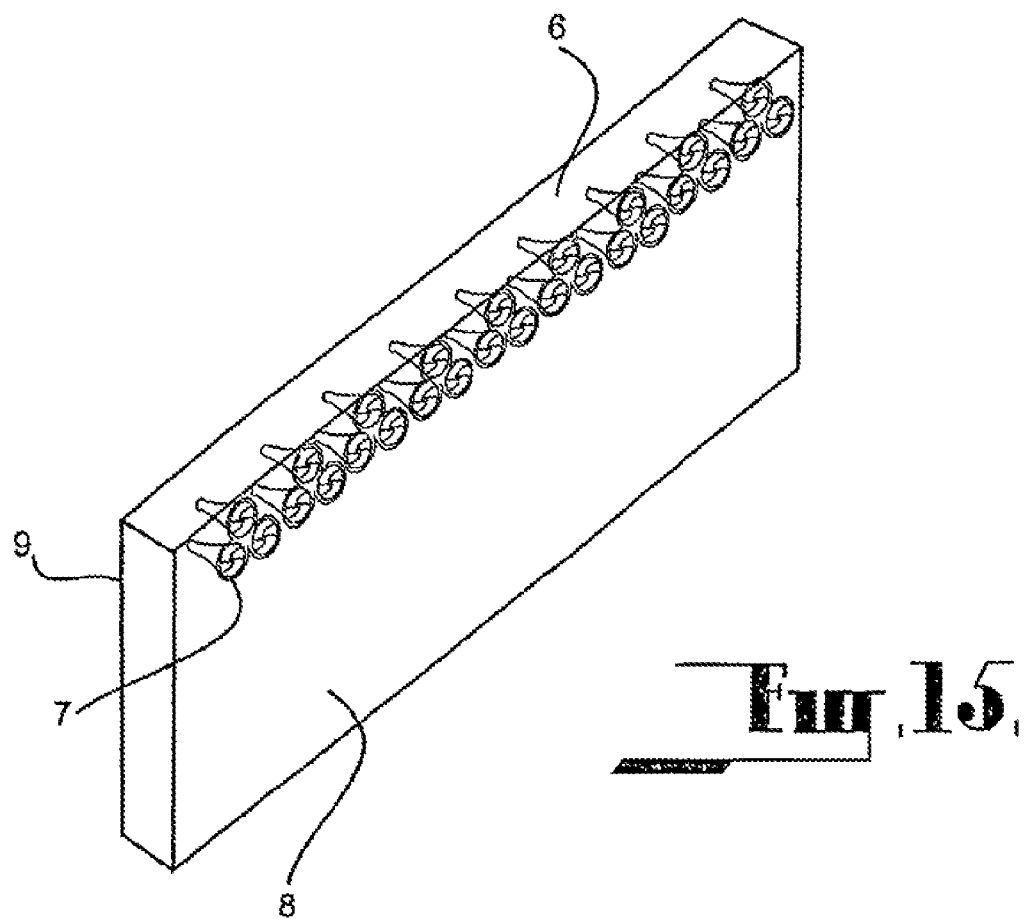
FIG. 15 is a schematic view of a cooling radiator for internal combustion engines and refrigeration systems.
Figure 16:
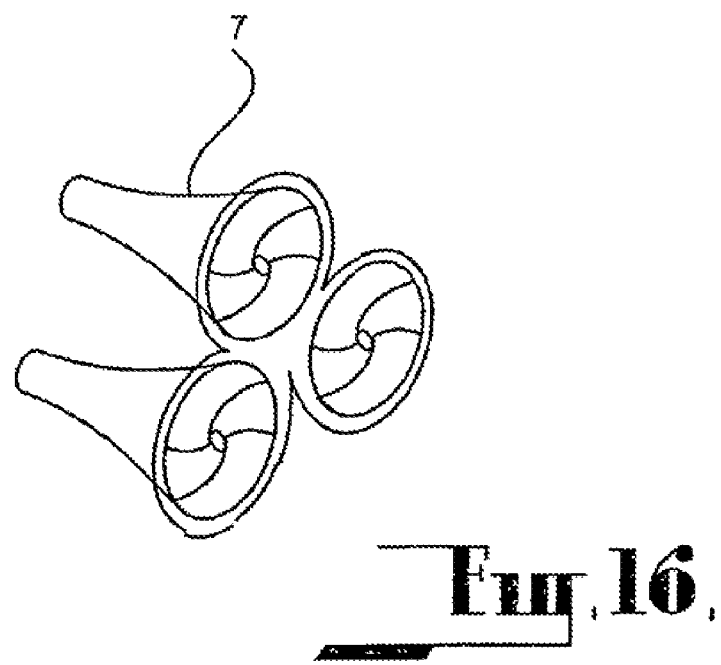
FIG. 16 is a close up schematic view of vanes of one form of the invention as they would appear in the radiator of FIGS. 14 and 15.

FIGS. 15 and 16 depict a tank of liquid or gas through which vanes or vents are passed and attached to front and rear walls so that another fluid medium may travel through the tank via the vanes. Alternatively (6) may be a solid block of material such as metal through which vents (7) are cut. The vanes or vents in FIGS. 14 and 15 may be shaped like an hourglass as in FIG. 16, in conformity with the principles described above. The passage of fluid through vents (7) creates a temperature differential between one side (8) of the tank or block (6) and the opposed side (9), thereby causing a heat interchange across the block.

It should be appreciated that the scope of the present invention need not be limited to the particular scope of the embodiments described above. Throughout the specification, unless the context requires otherwise, the word "comprise" or variations such as "comprises" or "comprising," will be understood to imply the inclusion of a stated integer or group of integers but not the exclusion of any other integer or group of integers.

What is claimed is:

1. A tank for conducting a heat exchange, the tank comprising:
    a wall including a front side and a rear side; and
    a plurality of vents disposed through the wall, a first end of each of the plurality of vents opening through the front side of the wall and a second end of each of the plurality of vents opening through the rear side of the wall, the plurality of vents each including an active surface positioned between the first end and the second end and substantially conforming in at least one dimension to a logarithmic spiral, the radius of the logarithmic spiral unfolding at a constant order of growth when measured at equiangular radii, and wherein passage of a fluid through the plurality of vents and over at least a portion of the active surface of each of the plurality of vents creates a temperature differential between the front side and the rear side of the wall, the temperature differential resulting in a heat exchange through the wall.

2. The tank of claim 1, wherein the active surface further substantially conforms in a second dimension to a logarithmic spiral, the radius of the logarithmic spiral unfolding at a constant order of growth when measured at equiangular radii in the second dimension.

3. The tank of claim 1, wherein a profile width of the plurality of vents increases as the plurality of vents extend from the front side of the wall to the rear side of the wall.

4. The tank of claim 1, wherein a profile width of the plurality of vents decreases as the plurality of vents extend from the front side of the wall to the rear side of the wall.

5. The tank of claim 1, wherein the plurality of vents include a second active surface substantially conforming in at least one dimension to a logarithmic spiral, the radius of the logarithmic spiral unfolding at a constant order of growth when measured at equiangular radii, and wherein passage of a fluid through the plurality of vents and over at least a portion of the second active surface of each of the plurality of vents further creates a temperature differential between the front side and the rear side of the wall, the temperature differential resulting in a heat exchange through the wall.

6. A tank for conducting a heat exchange, the tank comprising:
    a wall including a front side and a rear side; and
    a plurality of vents disposed through the wall, a first end of each of the plurality of vents opening through the front side of the wall and a second end of each of the plurality of vents opening through the rear side of the wall, the plurality of vents each including an active surface positioned between the first end and the second end and substantially conforming to the external configuration of a shell of the phylum Mollusca, class Gastropoda or Cephalopoda, and wherein passage of a fluid through the plurality of vents and over at least a portion of the active surface of each of the plurality of vents creates a temperature differential between the front side and the rear side of the wall, the temperature differential resulting in a heat exchange through the wall.

7. A tank for conducting a heat exchange, the tank comprising:
    a wall including a front side and a rear side; and
    a plurality of vents disposed through the wall, a first end of each of the plurality of vents opening through the front side of the wall and a second end of each of the plurality of vents opening through the rear side of the wall, the plurality of vents each including an active surface positioned between the first end and the second end and substantially conforming to the external configuration of a shell of the genera *Volutidea, Argonauta, Nautilus, Conidea,* or *Turbinidea*, and wherein passage of a fluid through the plurality of vents and over at least a portion of the active surface of each of the plurality of vents creates a temperature differential between the front side and the rear side of the wall, the temperature differential resulting in a heat exchange through the wall.

8. A tank for conducting a heat exchange, the tank comprising:
    a wall including a front side and a rear side; and
    a plurality of vents disposed through the wall, a first end of each of the plurality of vents opening through the front side of the wall and a second end of each of the plurality of vents opening through the rear side of the wall, the plurality of vents each including an active surface positioned between the first end and the second end and substantially conforming to the internal configuration of a shell of the phylum Mollusca, class Gastropoda or Cephalopoda, and wherein passage of a fluid through the plurality of vents and over at least a portion of the active surface of each of the plurality of vents creates a temperature differential between the front side and the rear side of the wall, the temperature differential resulting in a heat exchange through the wall.

9. A tank for conducting a heat exchange, the tank comprising:
    a wall including a front side and a rear side; and
    a plurality of vents disposed through the wall, a first end of each of the plurality of vents opening through the front side of the wall and a second end of each of the plurality of vents opening through the rear side of the wall, the plurality of vents each including an active surface positioned between the first end and the second end and substantially conforming to the internal configuration of a shell of the genera *Volutidea, Argonauta, Nautilus, Conidea,* or *Turbinidea*, and wherein passage of a fluid through the plurality of vents and over at least a portion of the active surface of each of the plurality of vents creates a temperature differential between the front side and the rear side of the wall, the temperature differential resulting in a heat exchange through the wall.

10. A tank for conducting a heat exchange, the tank comprising:
    a wall including a front side and a rear side; and
    a plurality of vents disposed through the wall, a first end of each of the plurality of vents opening through the front side of the wall and a second end of each of the plurality of vents opening through the rear side of the wall, the plurality of vents each including an active surface positioned between the first end and the second end and substantially conforming to the configuration of a whorl, and wherein passage of a fluid through the plurality of vents and over at least a portion of the active surface of each of the plurality of vents creates a temperature differential between the front side and the rear side of the wall, the temperature differential resulting in a heat exchange through the wall.

11. A tank for conducting a heat exchange, the tank comprising:
   a wall including a front side and a rear side; and
   a plurality of vents disposed through the wall, a first end of each of the plurality of vents opening through the front side of the wall and a second end of each of the plurality of vents opening through the rear side of the wall, wherein each of the plurality of vents includes a vane, the vane including an active surface positioned between the first end of the vent and the second end of the vent and substantially conforming in at least one dimension to a logarithmic spiral, the radius of the logarithmic spiral unfolding at a constant order of growth when measured at equiangular radii, and wherein passage of a fluid through the vents and over at least a portion of the active surface of the vane of each of the plurality of vents creates a temperature differential between the front side and the rear side of the wall, the temperature differential resulting in a heat exchange through the wall.

12. The tank of claim 11, wherein the plurality of vents include a second vane, the second vane including an active surface substantially conforming in at least one dimension to a logarithmic spiral, the radius of the logarithmic spiral unfolding at a constant order of growth when measured at equiangular radii, and wherein a passage of a fluid through the vents and over at least a portion of the active surface of the second vane of each of the plurality of vents further creates a temperature differential between the front side and the rear side of the wall, the temperature differential resulting in a heat exchange through the wall.

13. The tank of claim 11, wherein a profile width of the vane increases as the vane extends from the front side of the wall to the rear side of the wall.

14. The tank of claim 11, wherein a profile width of the vane decreases as the vane extends from the front side of the wall to the rear side of the wall.

15. The tank of claim 1, wherein the vane includes a second active surface.

16. A tank for conducting a heat exchange, the tank comprising:
   a wall including a front side and a rear side; and
   a plurality of vents disposed through the wall, a first end of each of the plurality of vents opening through the front side of the wall and a second end of each of the plurality of vents opening through the rear side of the wall, wherein each of the plurality of vents includes a vane, the vane including an active surface positioned between the first end of the vent and the second end of the vent and substantially conforming to the external configuration of a shell of the phylum Mollusca, class Gastropoda or Cephalopoda, and wherein passage of a fluid through the vents and over at least a portion of the active surface of the vane of each of the plurality of vents creates a temperature differential between the front side and the rear side of the wall, the temperature differential resulting in a heat exchange through the wall.

17. A tank for conducting a heat exchange, the tank comprising:
   a wall including a front side and a rear side; and
   a plurality of vents disposed through the wall, a first end of each of the plurality of vents opening through the front side of the wall and a second end of each of the plurality of vents opening through the rear side of the wall, wherein each of the plurality of vents includes a vane, the vane including an active surface positioned between the first end of the vent and the second end of the vent and substantially conforming to the external configuration of a shell of the genera *Volutidea, Argonauta, Nautilus, Conidea*, or *Turbinidea*, and wherein passage of a fluid through the vents and over at least a portion of the active surface of the vane of each of the plurality of vents creates a temperature differential between the front side and the rear side of the wall, the temperature differential resulting in a heat exchange through the wall.

18. A tank for conducting a heat exchange, the tank comprising:
   a wall including a front side and a rear side; and
   a plurality of vents disposed through the wall, a first end of each of the plurality of vents opening through the front side of the wall and a second end of each of the plurality of vents opening through the rear side of the wall, wherein each of the plurality of vents includes a vane, the vane including an active surface positioned between the first end of the vent and the second end of the vent and substantially conforming to the configuration of a whorl, and wherein passage of a fluid through the vents and over at least a portion of the active surface of the vane of each of the plurality of vents creates a temperature differential between the front side and the rear side of the wall, the temperature differential resulting in a heat exchange through the wall.

19. A tank for conducting a heat exchange, the tank comprising:
   a wall including a front side and a rear side; and
   a plurality of vents disposed through the wall, a first end of each of the plurality of vents opening through the front side of the wall and a second end of each of the plurality of vents opening through the rear side of the wall, wherein each of the plurality of vents includes a vane, the vane including an active surface positioned between the first end of the vent and the second end of the vent and substantially conforming to the internal configuration of a shell of the phylum Mollusca, class Gastropoda or Cephalopoda, and wherein passage of a fluid through the vents and over at least a portion of the active surface of the vane of each of the plurality of vents creates a temperature differential between the front side and the rear side of the wall, the temperature differential resulting in a heat exchange through the wall.

20. A tank for conducting a heat exchange, the tank comprising:
   a wall including a front side and a rear side; and
   a plurality of vents disposed through the wall, a first end of each of the plurality of vents opening through the front side of the wall and a second end of each of the plurality of vents opening through the rear side of the wall, wherein each of the plurality of vents includes a vane, the vane including an active surface positioned between the first end of the vent and the second end of the vent and substantially conforming to the internal configuration of a shell of the genera *Volutidea, Argonauta, Nautilus, Conidea*, or *Turbinidea*, and wherein passage of a fluid through the vents and over at least a portion of the active surface of the vane of each of the plurality of vents creates a temperature differential between the front side and the rear side of the wall, the temperature differential resulting in a heat exchange through the wall.

* * * * *